United States Patent
Ahn et al.

(10) Patent No.: US 8,053,664 B2
(45) Date of Patent: Nov. 8, 2011

(54) TRANSPARENT ELECTRODE HAVING THERMAL STABILITY, METHOD OF FABRICATING THE SAME AND DYE-SENSITIZED SOLAR CELL COMPRISING THE SAME

(75) Inventors: Kwang-Soon Ahn, Suwon-si (KR); Ji-Won Lee, Suwon-si (KR); Wha Sup Lee, Suwon-si (KR); Jae-Man Choi, Suwon-si (KR); Byong-Cheol Shin, Suwon-si (KR); Joung-Won Park, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 1108 days.

(21) Appl. No.: 11/314,534

(22) Filed: Dec. 22, 2005

(65) Prior Publication Data
US 2006/0137738 A1    Jun. 29, 2006

(30) Foreign Application Priority Data
Dec. 24, 2004    (KR) .................. 10-2004-0112165

(51) Int. Cl.
*H01L 31/00* (2006.01)
(52) U.S. Cl. .................. 136/252; 136/263
(58) Field of Classification Search .............. None
See application file for complete search history.

(56) References Cited

U.S. PATENT DOCUMENTS

| | | | |
|---|---|---|---|
| 5,463,057 A * | 10/1995 | Graetzel et al. ............ 546/4 |
| 6,099,982 A | 8/2000 | Katsuaki et al. |
| 6,379,569 B1 | 4/2002 | Rouberol |
| 6,777,477 B1 * | 8/2004 | Niume et al. ............ 524/430 |
| 2004/0248394 A1 * | 12/2004 | Kobayashi et al. ......... 438/609 |

FOREIGN PATENT DOCUMENTS

| | | |
|---|---|---|
| CN | 1382229 A | 11/2002 |
| CN | 1393938 A | 1/2003 |
| CN | 1419522 A | 5/2003 |
| CN | 1485928 A | 3/2004 |
| EP | 1 322 145 A2 | 6/2003 |
| EP | 1 322 145 A3 | 6/2003 |
| JP | 01-149485 | 6/1989 |
| JP | 1-149485 | 6/1989 |
| JP | 2-309511 | 12/1990 |
| JP | 03-015106 | 1/1991 |
| JP | 3-15107 | 1/1991 |

(Continued)

OTHER PUBLICATIONS

Sugihara Tadashi, JP06-128743 machine translation, 1994.*

(Continued)

*Primary Examiner* — Alexa Neckel
*Assistant Examiner* — Miriam Berdichevsky
(74) *Attorney, Agent, or Firm* — Christie, Parker & Hale, LLP

(57) ABSTRACT

A transparent electrode having thermal stability, composed of a transparent conductive material containing a pentavalent element, a method of fabricating the same, and a dye-sensitized solar cell including the electrode. The transparent electrode having thermal stability does not substantially deteriorate even when it is exposed to high temperatures and its conductivity is not reduced. Thus, the dye-sensitized solar cell including the electrode can have improved performance.

8 Claims, 2 Drawing Sheets

FOREIGN PATENT DOCUMENTS

| | | | |
|---|---|---|---|
| JP | 6-128743 | | 5/1994 |
| JP | 06128743 A | * | 5/1994 |
| JP | 7-45128 | | 2/1995 |
| JP | 7-257945 | | 10/1995 |
| JP | 7-335031 | | 12/1995 |
| JP | 09-150477 | | 6/1997 |
| JP | 11-67459 | | 3/1999 |
| JP | 11-302017 | | 11/1999 |
| JP | 2001-043741 | | 2/2001 |
| JP | P2002-93243 A | | 3/2002 |
| JP | 2002-260448 | | 9/2002 |
| JP | P2003-178625 A | | 6/2003 |
| KR | 1998-064117 | | 10/1998 |
| KR | 2003-0095417 | | 12/2003 |

OTHER PUBLICATIONS

English Search Report issued in European Patent Application No. 05112759.5—2203 on Apr. 28, 2006.

Vishwakarma, S.R. et al. "Physical Properties of Arsenic-Doped Tin Oxide Thin Films." *Elsevier Sequoia*. The Netherlands,1989: pp. 99-110.

Rumyantseva M. N. "Copper diffusion in $SnO_2$ polycrystalline films." *Journal of Materials Science Letters*. vol. 13, 1994: pp. 1632-1634.

Korean Office Action issued Apr. 27, 2006 in corresponding Korean Application No. 10-2004-0112165.

Office Action issued by Chinese Patent Office in Chinese Patent Application No. 2005101362725 on Sep. 5, 2008.

Office Action issued by the Japanese Patent Office dated Aug. 4, 2009, in Japanese Application No. 2005-372398.

Chinese Office Action dated Feb. 12, 2010, issued in corresponding Chinese Patent Application No. 2005101362725.

SIPO Office action dated Jun. 2, 2010, for corresponding Chinese Patent application 200510136272.5, with English translation, noting Japanese reference JP 6-128743, previously cited in U.S. Office action dated May 17, 2010.

SIPO Office action dated Sep. 14, 2010, for corresponding Chinese Patent application 200510136272.5, with English translation, noting references previously filed in an IDS dated Oct. 3, 2008.

Japanese Office action dated Feb. 8, 2011, for corresponding Japanese Patent application 2005-372398, noting listed references in this IDS, as well as JP 07-335031, previously filed in an IDS dated Oct. 27, 2009.

Patent Abstracts of Japan, and English machine translation of Japanese Publication 09-150477, listed above, 44 pages, Jun. 10, 1997.

Patent Abstracts of Japan, and English machine translation of Japanese Publication 2001-043741, listed above, 31 pages, Feb. 16, 2001.

* cited by examiner

TRANSPARENT ELECTRODE HAVING THERMAL STABILITY, METHOD OF FABRICATING THE SAME AND DYE-SENSITIZED SOLAR CELL COMPRISING THE SAME

CROSS-REFERENCE TO RELATED APPLICATION

This application claims the benefit of Korean Patent Application No. 2004-112165, filed on Dec. 24, 2004, in the Korean Intellectual Property Office, the disclosure of which is incorporated herein by reference.

BACKGROUND OF THE INVENTION

1. Field of the Invention

An aspect of the present invention relates to a transparent electrode having thermal stability, a method of fabricating the same, and a dye-sensitized solar cell including the electrode, and more particularly, to a transparent electrode having improved thermal stability and conductivity, a method of fabricating the same, and a dye-sensitized solar cell including the electrode.

2. Description of the Related Art

Recently, many studies on various flat panel displays such as plasma display panels (PDP), field emission devices, etc., next generation displays such as touch screen panels, and energy fields such as dye-sensitized solar cells, etc., have been conducted.

Among these, the dye-sensitized solar cell is a photoelectrochemical solar cell using photosensitive dye molecules capable of absorbing visible rays to produce electron-hole pairs and a semiconductor electrode which transfers the produced electrons. In a conventional silicon solar cell, absorption of solar energy and production of an electromotive force by separation of electron-hole pairs occur at the same time in a silicon semiconductor. Meanwhile, in the dye-sensitized solar cell, absorption of solar energy and transfer of charges occur separately. Specifically, dyes absorb solar energy and a semiconductor electrode transfers charges.

Photosensitive dye molecules are included in a porous membrane composed of a Ti oxide, etc., which is included in the semiconductor electrode. In this case, the semiconductor electrode may be a transparent conductive material having high transmittance and conductivity, as well as good thermal stability when the porous membrane is formed.

Examples of conventional transparent conductive materials used to form the semiconductor electrode include tin oxide ($SnO_2$), indium oxide ($In_2O_3$), zinc oxide ($ZnO_2$), indium tin oxide (ITO), indium tin zinc oxide, etc. For example, tin oxide containing indium oxide is disclosed in U.S. Pat. No. 6,099,982.

To improve the conductivity etc., these oxides are doped with Sn, Sb, or F. Among these, indium oxide doped with Sn and tin oxide doped with Sb or F are currently widely used. The indium oxide doped with Sn has a high conductivity due to a low resistance, but has poor thermal stability and chemical stability. Meanwhile, the tin oxide doped with Sb or F is known to have good thermal stability and chemical stability, but is limited in the industrial use since the dopant such as Sb is harmful.

The conventional transparent conductive materials listed above have insufficient thermal stability, chemical stability, and toxicity for use in various industrial fields, in particular, in dye-sensitized solar cells, and thus, an improvement in said characteristics is required.

SUMMARY OF THE INVENTION

An aspect of the present invention provides a transparent electrode having good thermal stability as well as high transmittance and conductivity, and a method of fabricating the same.

An aspect of the present invention also provides a dye-sensitized solar cell including the transparent electrode.

According to an aspect of the present invention, there is provided a transparent electrode having thermal stability, composed of a transparent conductive material containing a pentavalent element.

According to another aspect of the present invention, the pentavalent element may be at least one selected from the group consisting of Group 5 elements or Group 15 elements.

According to another aspect of the present invention, the Group 5 element may be Nb and the Group 15 element may be P, As, or Bi.

According to another aspect of the present invention, the transparent conductive material may be tin oxide, tin oxide doped with indium or fluorine, indium oxide, indium oxide doped with tin, zinc oxide, or indium tin oxide.

According to another aspect of the present invention, there is provided a method of fabricating a transparent electrode having thermal stability, including: providing a transparent conductor composed of a transparent conductive material; combining the transparent conductor with a mixture of a pentavalent element source and a solvent; and performing a thermal treatment on the transparent conductor.

According to another aspect of the present invention, the transparent conductive material may be tin oxide, tin oxide doped with indium or fluorine, indium oxide, indium oxide doped with tin, zinc oxide, or indium tin oxide.

According to another aspect of the present invention, the pentavalent element source may be at least one selected from the group consisting of Group 5 element-containing compounds or Group 15 element-containing compounds.

According to another aspect of the present invention, the pentavalent element source may be at least one selected from the group consisting of $PF_5$, $AsF_5$, $VF_5$, $NbF_5$, $TaF_5$, $VCl_5$, $NbCl_5$, and $TaCl_5$.

According to another aspect of the present invention, the thermal treatment may be carried out at 300-600° C.

According to another aspect of the present invention, there is provided a method of fabricating a transparent electrode having thermal stability, including: depositing a deposition source including a transparent conductive material, a pentavalent element source, or a transparent conductive material and a pentavalent element source to a substrate.

According to another aspect of the present invention, the transparent conductive material may be tin oxide, tin oxide doped with indium or fluorine, indium oxide, indium oxide doped with tin, zinc oxide, or indium tin oxide.

According to another aspect of the present invention, the pentavalent element source may be at least one selected from the group consisting of Group 5 element-containing compounds or Group 15 element-containing compounds.

According to another aspect of the present invention, the deposition may be carried out using chemical vapor deposition, evaporation, e-beam deposition, electrochemical anodization, or electrochemical deposition.

According to another aspect of the present invention, there is provided a dye-sensitized solar cell including: a first electrode and a second electrode facing each other; a porous membrane interposed between the first electrode and the second electrode and having a dye adsorbed thereto; and an electrolyte interposed between the first electrode and the second electrode; wherein the first electrode is the transparent electrode having thermal stability, described above or the transparent electrode having thermal stability, fabricated using the method described above.

According to another aspect of the present invention, the transparent electrode having thermal stability according to an embodiment of the present invention has excellent transmittance, conductivity, and thermal stability, and thus, deterioration such as a reduction in conductivity due to exposure to high temperatures is not caused. Such a transparent electrode is useful for various applications such as flat panel displays, touch screen panels, and dye-sensitized solar cells.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
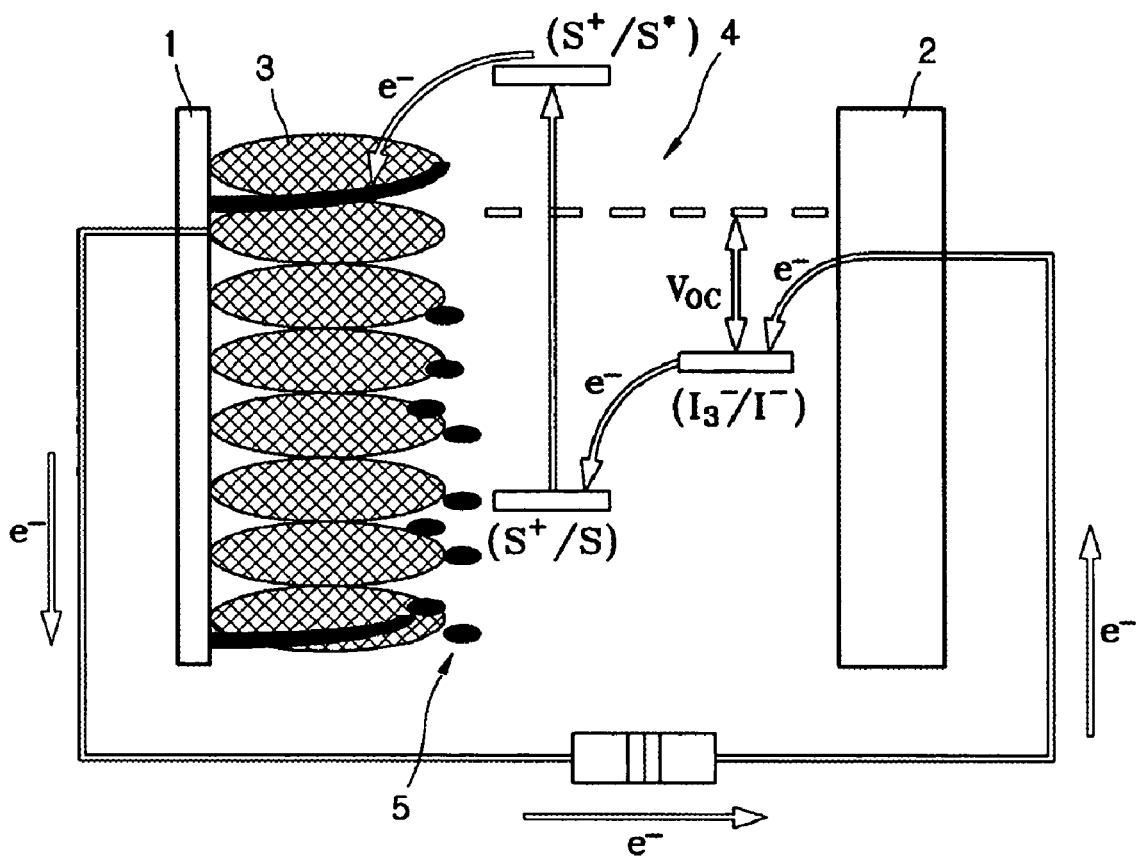
FIG. 1 is a schematic diagram of a dye-sensitized solar cell having a transparent electrode having thermal stability according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

A transparent electrode having thermal stability according to an embodiment of the present invention is composed of a transparent conductive material containing a pentavalent element.

The pentavalent element may be at least one selected from the group consisting of Group 5 elements or Group 15 elements. More specifically, the Group 5 element may be V, Nb, or Ta, and the Group 15 element may be N, P, As, or Bi. The pentavalent element may be Nb. Among Group 15 elements, Sb is not preferable due to its toxicity.

The transparent conductive material may be any material having transparency and conductivity. Examples of the transparent conductive material include, but are not limited to, tin oxide, tin oxide doped with indium or fluorine, indium oxide, indium oxide doped with tin, zinc oxide, or indium tin oxide.

The content of the pentavalent element in the transparent electrode is 0.01-20 atomic %, preferably 0.01-10 atomic %. When the content of the pentavalent element is less than 0.01 atomic %, the resistance of the transparent electrode is not maintained and electrode deterioration is not prevented. When the content of the pentavalent element is greater than 20 atomic %, it may interfere with the transfer of electrons.

While not intending to be bound by a particular theory, it is believed that the pentavalent element substitutes for one of elements of the transparent conductive material, for example, Sn, In, or Zn, to serve as an electron donor, or causes lattice distortion of the transparent conductive material to form excess of oxygen vacancy. The oxygen vacancy produced by lattice distortion is not sensitive to temperature unlike oxygen vacancy produced by heat equilibrium. Thus, the transparent electrode having thermal stability according to an embodiment of the present invention cannot bring about a reduction in resistance even when it is exposed to high temperatures.

Furthermore, it is known that the pentavalent electron forms a stronger bond with oxygen than other elements of the transparent conductive material, for example, Sn, In, and Zn, and thus the transparent electrode deteriorate even when exposed to high temperatures.

The transparent electrode having thermal stability can be fabricated by treating a conductor composed of a transparent conductive material with a pentavalent element source or by depositing a deposition source including a transparent conductive material, a pentavalent element source, or a transparent conductive material and a pentavalent element source on a substrate.

A method of fabricating the transparent electrode having thermal stability according to an embodiment of the present invention includes: providing a transparent conductor composed of a transparent conductive material; combining the transparent conductor with a mixture of a pentavalent element source and a solvent; and performing a thermal treatment on the transparent conductor.

The transparent conductive material may be any material having both transparency and conductivity, as described above. Examples of the transparent conductive material include, but are not limited to, tin oxide, tin oxide doped with indium or fluorine, indium oxide, indium oxide doped with tin, zinc oxide, or indium tin oxide.

The pentavalent element source may be at least one selected from the group consisting of Group 5 element-containing compounds or Group 15 element-containing compounds. More specifically, the pentavalent element source may be a Group 5 element or Group 15 element-containing fluoride or chloride. Examples of the pentavalent element source include, but are not limited to, $PF_5$, $AsF_5$, $VF_5$, $NbF_5$, $TaF_5$, $VCl_5$, $NbCl_5$, and $TaCl_5$. The pentavalent element source may be $NbCl_5$.

The solvent may be any solvent that can dissolve the pentavalent element. Examples of a useful material as the solvent include, but are not limited to, ethanol, butanol, and methanol. These solvents may be used in a combination of two or more. The solvent may be ethanol.

The pentavalent element source may be dissolved in the solvent in a concentration of 1-60 mM, preferably 10-30 mM, more preferably 10-20 mM. When the concentration of the pentavalent element source is less than 1 mM, the resistance of the transparent electrode is not maintained and the deterioration of the transparent electrode is not prevented. When the concentration of the pentavalent element source is greater than 60 mM, it may interfere with the transfer of electrons.

The conductor composed of the transparent conductive material may be combined with the mixture of the pentavalent element source and the solvent using any method, but wet coating as is typically known in the art may be used. Examples of the wet coating include spin coating, dipping, and spray coating.

The thermal treatment allows the pentavalent element of the pentavalent element source to substitute for one element of the transparent conductive material. The thermal treatment may be carried out at 300-600° C., preferably at 400-550° C., more preferably at 500° C. A thermal treatment time may vary according to the thermal treatment temperature. When the thermal treatment temperature is lower than 300° C., the substitution of the pentavalent element may not be sufficient. When the thermal treatment temperature is higher than 600° C., the substrate may be melted.

A method of fabricating the transparent electrode having thermal stability according to another embodiment of the present invention includes depositing a deposition source including a transparent conductive material, a pentavalent element source, or a transparent conductive material and a pentavalent element source on a substrate. That is, the pentavalent element source may be used as an additive when a conductor composed of the transparent conductive material is formed. The transparent conductive material may be any material having both transparency and conductivity, as described above. Examples of the transparent conductive material include, but are not limited to, tin oxide, tin oxide doped with indium or fluorine, indium oxide, indium oxide doped with tin, zinc oxide, or indium tin oxide.

The pentavalent element source may be at least one selected from the group consisting of Group 5 element-containing compounds or Group 15 element-containing compounds. More specifically, the pentavalent element source may be a Group 5 element or Group 15 element-containing fluoride or chloride. Examples of the pentavalent element source include, but are not limited to, $PF_5$, $AsF_5$, $VF_5$, $NbF_5$, $TaF_5$, $VCl_5$, $NbCl_5$, and $TaCl_5$. The pentavalent element source may be $NbCl_5$.

A deposition source composed of the transparent material and a deposition source composed of the pentavalent element source can be separately prepared, and simultaneously used upon deposition. If necessary, two or more deposition sources which are composed of the pentavalent element source may be used. By simultaneously using the deposition source composed of the pentavalent element source and the deposition source composed of the transparent conductive material, the pentavalent element and the transparent conductive material can be simultaneously deposited to form a single layer. The proportion of the pentavalent element in the single layer may be altered by adjusting electric power applied to the deposition source in a predetermined range.

Alternatively, a deposition source composed of a pentavalent element source and a transparent conductive material, which is prepared by treating the pentavalent element source and the transparent conductive material according to mechanical alloying, can be used. A content ratio of the pentavalent element and the transparent conductive material in the transparent electrode can be altered by adjusting a mixing ratio of both materials when the deposition source composed of a pentavalent element source and a transparent conductive material is prepared.

The deposition may be carried out using various methods which are typically used in the art. Examples of the deposition method include, but are not limited to, chemical vapor deposition, evaporation, e-beam deposition, electrochemical anodization, and electrochemical deposition.

The transparent electrode having thermal stability described above is useful for various flat panel displays, such as plasma display panels and electroluminescent devices, touch panel screens etc., and solar cells, etc.

The transparent electrode having thermal stability is suitable for a dye-sensitized solar cell which can be inexpensively manufactured and is environmentally friendly and flexible. FIG. 1 is a schematic diagram of a dye-sensitized solar cell according to an embodiment of the present invention.

Referring to FIG. 1, photons from incident sunlight are first absorbed by the dye molecules 5. The dye molecules 5 are excited to form an electron-hole pair. The excited dye molecules 5 send electrons to the porous membrane 3 composed of transition metal oxide. The electrons migrate via the first electrode 1 to an external circuit, and then enter the second electrode 2.

The first electrode 1 may be the transparent electrode having thermal stability according to an embodiment of the present invention or the transparent electrode having thermal stability fabricated using the fabrication method thereof according to an embodiment of the present invention. When the porous membrane 3 composed of transition metal oxide is formed, a high temperature of about 500° C. or higher may be required. Thus, the first electrode 1 may deteriorate due to exposure to a high temperature, resulting in a reduction in conductivity of the first electrode. This can interfere with the transfer of electrons generated due to photon absorption of dye molecules 5, resulting in a reduction in performance of the dye-sensitized solar cell. However, the transparent electrode having thermal stability according to an embodiment of the present invention does not deteriorate even when it is exposed to a high temperature, and its conductivity is not reduced, and thus, high lifespan and performance of the dye-sensitized solar cell can be assured.

A material for the dye molecules 5 may be a complex compound containing at least one metal selected from the group consisting of Fe, Ru, Os, Rh, Pd, and Ir, which can effectively absorb sunlight to produce photoelectromotive force. A ligand contained in the dye molecule 5 may be a bidendate chelate, tridendate chelate, or multidendate chelate polypyridyl compound. At least one polypyridyl compound may contain a cyano group. Examples of the dye molecule include, but are not limited to, cis-[bisthiacyanato bis(4,4'-dicarboxy-2,2'-bipyridine)] Ru (II), acetylacetonate thiocyanate (4,4',4''-tricarboxy-2,2',2'',6-terpyridine) Ru (II), trifluoroacetylacetonate-thiocyanate (4,4',4''-tricarboxy-2,2',2'', 6-terpyridine) Ru (II), and trifluoroacetylmethylhexylketonate thiocyanate (4,4',4''-tricarboxy-2,2',2'',6-terpyridine) Ru (II).

The dye molecule 5 oxidized due to transfer of electrons is reduced by a redox couple in the electrolyte, for example, an iodide ($I^-$). The resulting oxidized triodide ($I_3^-$) accepts electrons, which reach the interface of the second electrode 2, in order to achieve charge neutrality, which allows the dye-sensitized solar cell to operate.

The electrolyte including the redox couple may include an iodine/iodide solution, a bromine/bromide solution, a hydroquinone solution, or a transition metal complex solution which transfers non-boning electrons. The electrolyte may be an iodine/iodide solution, for example, a solution containing iodine and dimethylhexylimidazolium iodide or a solution containing iodine and tetrapropylammonium iodide.

Although the dye-sensitized solar cell has been described as an example of a device including the transparent electrode having thermal stability according to an embodiment of the present invention, the application of the transparent electrode having thermal stability is not limited to thereto.

The present invention will now be described in greater detail with reference to the following examples. The following examples are for illustrative purposes only and are not intended to limit the scope of the invention.

EXAMPLES

Example 1

A 0.1 μm thick conductor which was composed of tin oxide was immersed in a 20 mM $NbCl_5$ solution in ethanol. After 30 seconds, the conductor was washed with ethanol and dried at room temperature. The dried conductor was subjected to a thermal treatment in a furnace at 500° C. for 30 minutes. The obtained electrode is called Sample 1.

Example 2

An electrode was fabricated in the same manner as in Example 1, except that a 10 mM $NbCl_5$ solution substituted for the 20 mM $NbCl_5$ solution. This is called Sample 2.

Example 3

An electrode was fabricated in the same manner as in Example 1, except that a 15 mM $NbCl_5$ solution substituted for the 20 mM $NbCl_5$ solution. This is called Sample 3.

Comparative Example 1

A 0.1 μm thick conductor which was composed of tin oxide was prepared. This is called Sample A.

Experimental Example 1

Interfacial Resistance

The interfacial resistance of Sample 1 and Sample A was measured before and after thermal treatment, and the results are illustrated in Table 1. The initial interfacial resistance of each sample was measured using a four point probe, and then the interfacial resistance of each sample was measured again after performing a thermal treatment on each sample at 500° C. for 30 minutes.

TABLE 1

| Sample | Initial interfacial resistance | Interfacial resistance after thermal treatment |
| --- | --- | --- |
| Sample A | 10-11 Ω/□ | 31-33 Ω/□ |
| Sample B | 10-11 Ω/□ | 10-13 Ω/□ |

Referring to Table 1, the initial interfacial resistance of Sample 1 was equal to that of Sample A (10-11Ω/□). However, after performing a thermal treatment at 500° C. for 30 minutes, the interfacial resistance of Sample A significantly increased (31-33Ω/□), whereas the interfacial resistance of Sample 1 remained almost the same (10-13Ω/□). Therefore, it can be seen that Sample 1 had good thermal stability, and thus its conductivity was not reduced even when it was exposed to high temperatures.

Preparation Example

Manufacture of a Dye-Sensitized Solar Cell Including an Electrode Composed of Tin Oxide Containing Nb In the present Example, Sample 1 obtained from Example 1 was used as a substrate to manufacture a dye-sensitized solar cell.

Sample 1 obtained from Example 1 was used to prepare a rectangular substrate having an area of 1 $cm^2$. Then, a dispersion of Ti oxide particles with a particle diameter of 5 to 15 nm was applied to the substrate using a doctor blade and was subjected to a thermal treatment at 450° C. for 30 min to prepare a porous Ti oxide membrane with a thickness of 10 μm. Then, the porous Ti oxide membrane was immersed in a 0.3 mM Ru(4,4'-dicarboxy-2,2'-bipyridine)$_2$(NCS)$_2$ dye solution in ethanol for 12 hrs while maintaining the temperature of the membrane at 80° C. The dye adsorbed porous Ti oxide membrane was washed with ethanol and dried at room temperature to manufacture a photocathode for a dye-sensitized solar cell.

To manufacture a counter electrode of a dye-sensitized solar cell, Pt was deposited on a Sn oxide conductor doped with indium, and then a micro hole for injecting an electrolyte was formed using a drill with a diameter of 0.75 mm.

A 60 μm thick thermoplastic polymer film (trade name: Surlyn, available from DuPont) was placed between the photocathode and the counter electrode and was pressed at 100° C. for 9 sec to join the two electrodes. An oxidation-reduction electrolyte was injected into the space between the two electrodes through the micro hole formed in the counter electrode. Subsequently, the micro hole is closed with a cover glass and a thermoplastic polymer film (trade name: Surlyn, available from DuPont) to complete the dye-sensitized solar cell. The used oxidation-reduction electrolyte was a solution of 21.928 g of tetrapropylammonium iodide and 1.931 g of $I_2$ in a 4:1 mixture of ethylene carbonate and acetonitrile. The obtained dye-sensitized solar cell is called Solar Cell 1.

Comparative Example 2

A dye-sensitized solar cell was manufactured in the same manner as in above the Preparation Example, except that Sample A substituted for Sample 1. The obtained dye-sensitized solar cell is called Solar Cell A.

Experimental Example 2

Performance of Dye-Sensitized Solar Cell

Figure 2:
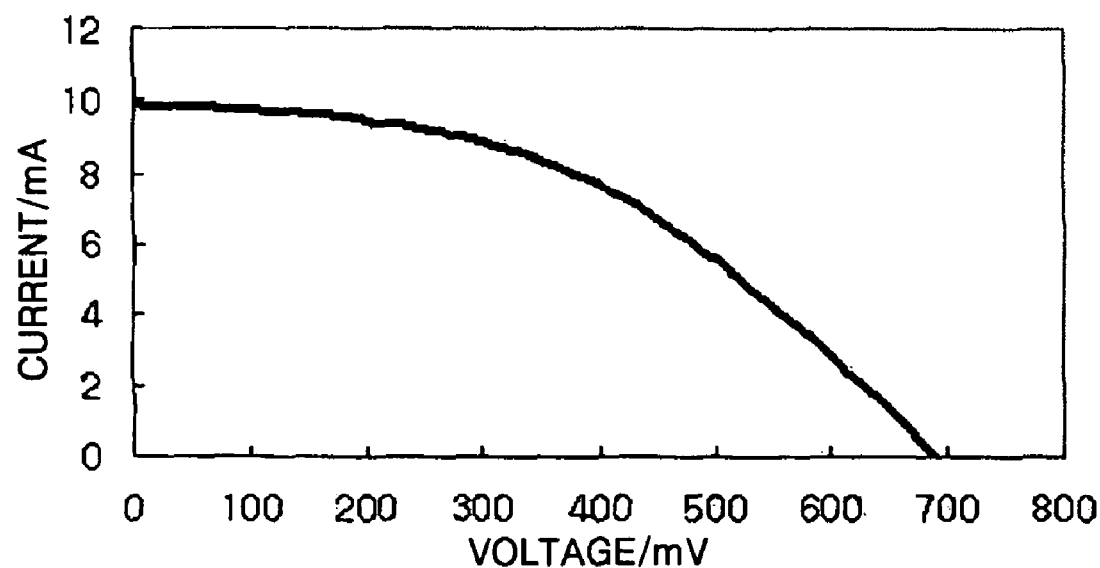
FIG. 2 is a current-voltage curve of a conventional electrode.
Figure 3:
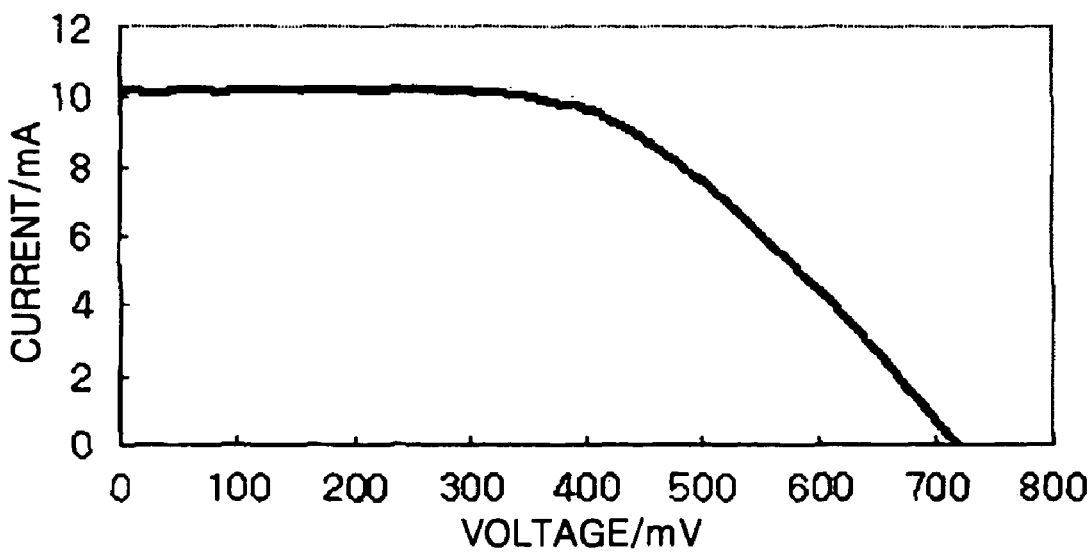
FIG. 3 is a current-voltage curve of a transparent electrode having thermal stability according to an embodiment of the present invention.

To evaluate the performance of Solar Cell 1 and Solar Cell A, the efficiency, open circuit voltage, short circuit current, and fill factor of both cells were determined and the results are illustrated in Table 2. Current-voltage curves of the solar cells were prepared using light source of 100 mW/$cm^2$ intensity and an Si standard cell. FIG. 2 illustrates the current-voltage curve of Solar Cell A and FIG. 3 illustrates the current-voltage curve of Solar Cell 1. The efficiency, open circuit voltage, short circuit current, and fill factor of the solar cells were calculated from the current-voltage curves.

TABLE 2

| | Efficiency | Open circuit voltage | Short circuit current | Fill factor |
| --- | --- | --- | --- | --- |
| Solar Cell A | 3.074% | 0.69 V | 9.86 mA/$cm^2$ | 0.451 |
| Solar Cell 1 | 3.947% | 0.718 V | 10.18 mA/$cm^2$ | 0.541 |

Referring to Table 2, the efficiency, open circuit voltage, short circuit current, and fill factor of Solar Cell 1 are higher than the efficiency, open circuit voltage, short circuit current, and fill factor of Solar Cell A. Accordingly, it can be seen that electrode deterioration does not occur in Solar Cell 1 due to a high temperature thermal treatment when manufacturing Solar Cell 1.

The transparent electrode having thermal stability according to an embodiment of the present invention has excellent thermal stability as well as high transparency and conductivity, and thus does not deteriorate due to heat when various devices including the electrode are manufactured or operated, and its conductivity is not reduced. In particular, a dye-sensitized solar cell including the transparent electrode having thermal stability can have improved performance.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A solar cell comprising:
   a first electrode and a second electrode facing each other;
   a porous membrane interposed between the first electrode and the second electrode and having a dye adsorbed thereto; and
   an electrolyte interposed between the first electrode and the second electrode,
   wherein the first electrode is a transparent electrode having thermal stability, the first electrode including a transparent conductive material containing 0.01-20 atomic % of a pentavalent element, and
   wherein the pentavalent element and the pentavalent element being homogeneously dispersed in the transparent conductive material, is at least one selected from the group consisting of N, P, and Bi.

2. The solar cell of claim 1, wherein the transparent conductive material is tin oxide, tin oxide doped with indium or fluorine, indium oxide, indium oxide doped with tin, zinc oxide, or indium tin oxide.

3. A solar cell comprising:
   a first electrode and a second electrode facing each other;
   a porous membrane interposed between the first electrode and the second electrode and having a dye adsorbed thereto; and
   an electrolyte interposed between the first electrode and the second electrode,
   wherein the first electrode is a transparent electrode having thermal stability, the first electrode including a transparent conductive material containing Bi, and the Bi being homogeneously dispersed in the transparent conductive material.

4. The solar cell of claim 3, wherein the transparent conductive material is tin oxide, tin oxide doped with indium or fluorine, indium oxide, indium oxide doped with tin, zinc oxide, or indium tin oxide.

5. A solar cell comprising:
   a first electrode and a second electrode facing each other;
   a porous membrane interposed between the first electrode and the second electrode and having a dye adsorbed thereto; and
   an electrolyte interposed between the first electrode and the second electrode,
   wherein the first electrode is a transparent electrode having thermal stability, the first electrode including a transparent conductive material containing 0.01-20 atomic % of a pentavalent element and the pentavalent element being homogeneously dispersed in the transparent conductive material, and
   wherein the transparent conductive material is tin oxide doped with indium or fluorine, indium oxide, indium oxide doped with tin or indium tin oxide.

6. The solar cell of claim 5, wherein the pentavalent element is at least one selected from the group consisting of Group 5 elements and Group 15 elements.

7. The solar cell of claim 6, wherein the Group 5 element is Nb.

8. The solar cell of claim 6, wherein the Group 15 element is N, P, As, or Bi.

* * * * *